(12) United States Patent
Chou et al.

(10) Patent No.: US 7,182,880 B2
(45) Date of Patent: Feb. 27, 2007

(54) PROCESS FOR REDUCING PARTICLE FORMATION DURING ETCHING

(75) Inventors: Wen-Chi Chou, Kaohsiung (TW); Kuang-Ya Li, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 295 days.

(21) Appl. No.: 10/813,785

(22) Filed: Mar. 30, 2004

(65) Prior Publication Data
US 2005/0218116 A1    Oct. 6, 2005

(51) Int. Cl.
*B44C 1/22* (2006.01)

(52) U.S. Cl. .................. 216/67; 156/345.48

(58) Field of Classification Search ............... 118/728; 156/345.51; 216/67
See application file for complete search history.

(56) References Cited

U.S. PATENT DOCUMENTS 6,465,051 B1 * 10/2002 Sahin et al. .............. 427/534
2002/0072016 A1 * 6/2002 Chen et al. ............... 430/323
2004/0011466 A1 * 1/2004 Matsumoto et al. ... 156/345.48
2004/0040665 A1 * 3/2004 Mizuno et al. ......... 156/345.51

* cited by examiner

Primary Examiner—Allan Olsen
(74) Attorney, Agent, or Firm—Tung & Associates

(57) ABSTRACT

A process for reducing the formation of potential device-contaminating particles in a process chamber, particularly an etch chamber or a pre-clean chamber used to pre-clean substrates prior to a PVD or other process. The process chamber conventionally includes multiple antennae, the purpose of which is to conduct bias power from a bias power source to a substrate supported on a pedestal assembly. According to the process of the invention, the antennae are removed from the pedestal assembly. Accordingly, the antennae, no longer present in the chamber during substrate processing, are capable of neither generating potential device-contaminating particles nor causing electrical arcing between the pedestal assembly and the chamber wall or other elements in the process chamber, leading to operational power loss.

20 Claims, 2 Drawing Sheets

PROCESS FOR REDUCING PARTICLE FORMATION DURING ETCHING

FIELD OF THE INVENTION

The present invention relates to etching processes used to etch material layers on a semiconductor wafer substrate in the fabrication of integrated circuit devices on the substrate. More particularly, the present invention relates to a process for reducing formation of particles during a plasma etch process by removing particle-generating polysilicon antennae from an etch chamber, particularly a pre-clean chamber.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include sequential deposition of conductive and insulative layers on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove material from one or more conducting layers from the areas not covered by the mask, thereby etching the conducting layer or layers in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

Plasma vapor deposition (PVD) is frequently used to deposit metal conductive layers for interconnect metallization on a substrate. Any chemical residue or oxide which remains on the substrate prior to the PVD process can act as a dielectric shield and prevent the subsequently-deposited PVD film from uniformly adhering to the substrate. Therefore, prior to the PVD process, each substrate frequently undergoes a pre-cleaning process in a pre-clean chamber to remove chemical residues or oxides which may be formed while the substrate is exposed to the clean room atmosphere. The pre-cleaning process is carried out in a pre-clean chamber, which applies a light, non-selective, non-reactive plasma etch to the substrate to remove chemical residues such as oxides remaining on the substrate surface.

Referring to the schematic of FIG. 1, a typical conventional pre-clean chamber is generally indicated by reference numeral 10 and typically includes a chamber base 12 having a typically grounded chamber wall 14. The chamber base 12 is closed by a removable lid or cover 22 and contains a pedestal assembly 18 which can typically be raised and lowered on a shaft 20 by actuation of a pedestal lift assembly 16. An ICP (inductively-coupled plasma) coil 24 surrounds the upper portion of the pre-clean chamber 10 and is connected to an RF source power supply 26 which operates at a frequency of typically about 400 KHz. The pedestal assembly 18 is connected, through an RF match network 30 which matches impedances, to an RF bias power supply 28 which operates at a frequency of typically about 13.56 MHz.

During operation of the pre-clean chamber 10, the pedestal assembly 18 supports a wafer substrate 32 in the chamber base 12. A plasma-generating source gas, such as argon, is introduced into the chamber 10 by a gas supply (not shown). Volatile reaction products and unreacted plasma species are removed from the chamber 10 by a gas removal mechanism (not shown).

Source power such as a high voltage signal, provided by the RF source power supply 26, is applied to the ICP coil 24 to ignite and sustain a plasma in the chamber 10. Ignition of a plasma in the chamber 10 is accomplished primarily by electrostatic coupling of the ICP coil 24 with the source gas, due to the large-magnitude voltage applied to the ICP coil 24 and the resulting electric fields produced in the chamber 10. Once ignited, the plasma is sustained by electromagnetic induction effects associated with time-varying magnetic fields produced by the alternating currents applied to the ICP coil 24. Through the RF bias power supply 28, the pedestal assembly 18 is typically electrically biased to provide to the substrate 32 ion energies that are independent of the RF voltage applied to the chamber 10 through the ICP coil 24 and RF source power supply 26. This facilitates more precise control over the energies of the etchant ions that bombard the surface of the substrate 32.

As shown in FIG. 2, the pedestal assembly 18 typically includes a pedestal 34 which is aluminum, titanium or other non-reactive metal. The pedestal 34 is seated in an insulator 36, which is typically a non-reactive insulative material such as ceramic or quartz. Multiple lift pin openings 38 may extend through the pedestal assembly 18 and receive respective lift pins (not shown) for the lowering and lifting of a substrate 32 onto and from, respectively, a quartz cover plate 40 provided on the pedestal 34. Multiple (typically three) antennae 42, each of which is typically polysilicon, extend through respective openings provided in the insulator 36 and contact the pedestal 34. The antennae 42 apply bias power from the bias power supply 28 to the substrate 32. During the pre-clean process, the insulator 36 inhibits conductivity to the pedestal 34 and other parts of the pedestal assembly 18, thereby confining the etchant plasma to the surface of the substrate 32.

One of the problems associated with the conventional pre-clean chamber 10 is that the multiple antennae 42 are exposed to the interior of the chamber 10 through respective slots or windows (not shown) provided in the insulator 36. While this facilitates accurate and stable measurements of the bias power applied to the pedestal 34 through the bias power supply 28, in the event that the antennae 42 are installed incorrectly in the insulator 36, an impedance mismatch may occur. As a result, plasma may produce a high reflective power in the chamber 10 and damage the antennae 42. The damaged antennae 42 serve as a major source of particles which may potentially contaminate devices being fabricated on the substrate 32.

Moreover, because each of the antennae 42 is typically held in place using a copper clip (not shown) which conducts electrical current between the pedestal 34 and the antenna 42, the antennae 42 may serve as conduits for electrical arcing between the pedestal 34 and the chamber wall 14. Such electrical arcing induces operational power loss and requires re-tuning of the source power supply 26 and/or the RF match network 30 to stabilize the operational power. Therefore, a process is needed for reducing the generation of potential device-contaminating particles and preventing electrical arcing in a pre-clean chamber during a substrate pre-clean process.

An object of the present invention is to provide a novel process which is suitable for reducing the generation of particles during a pre-clean or other etch process.

Another object of the present invention is to provide a novel process which is suitable for preventing electrical arcing in a pre-clean or other etch chamber.

Still another object of the present invention is to provide a novel process which is suitable for preventing contamination of devices being fabricated on a substrate.

Yet another object of the present invention is to provide a novel process which increases the yield of devices fabricated on a substrate.

A still further object of the present invention is to provide a novel process for reducing formation of particles in an antenna-containing pre-clean or other etch chamber, which process includes removing the particle-generating antennae from the chamber.

Yet another object of the present invention is to provide a novel process for reducing the generation of particles in a pre-clean or etch chamber, which process includes the removal of potential particle-generating antennae from the chamber and may further include a multi-step plasma ignition control or power adjustment sequence to match chamber impedences and reduce reflective power and enhance process stability in a pre-clean or etch process.

SUMMARY OF THE INVENTION

In accordance with these and other objects and advantages, the present invention is generally directed to a novel process for reducing the formation of potential device-contaminating particles in a process chamber, particularly an etch chamber or a pre-clean chamber used to pre-clean substrates prior to a PVD or other process. The process chamber conventionally includes multiple antennae, the purpose of which is to conduct bias power from a bias power source to a substrate supported on a pedestal assembly. According to the process of the invention, the antennae are removed from the pedestal assembly. Accordingly, the antennae, no longer present in the chamber during substrate processing, are capable of neither generating potential device-contaminating particles nor causing electrical arcing between the pedestal assembly and the chamber wall or other elements in the process chamber, leading to operational power loss. The Cp yield data and WAT data of the process of the invention have been shown to be comparable with the Cp yield data and WAT data of the conventional pre-clean process. Furthermore, the process results in simpler and more effective and efficient periodic maintenance (PM) of the chamber and eliminates the possibility of antenna-induced malfunctioning during chamber operation.

The process may further include the step of matching chamber impedences in a process chamber from which antennae have been removed, by providing a multi-step plasma ignition control or power adjustment sequence to maintain stable process conditions in the chamber. This sequence adjusts the forward and reflective RF power to maintain a stable DC bias power during plasma induction. The process or sequence may include a multi-step power ramp-up procedure for applying source and bias RF energies of gradually increasing magnitude to the chamber. The multi-step ramp-up procedure may include, for example, initially ramping the RF source power up from 0 watts to typically about 100 watts, followed by ramping the RF source power up from typically about 100 watts to typically about 340 watts for the substrate etching or cleaning step.

BRIEF DESCRIPTION OF THE DRAWINGS

The invention will now be described, by way of example, with reference to the accompanying drawings, in which.

DETAILED DESCRIPTION OF THE INVENTION

Figure 1:
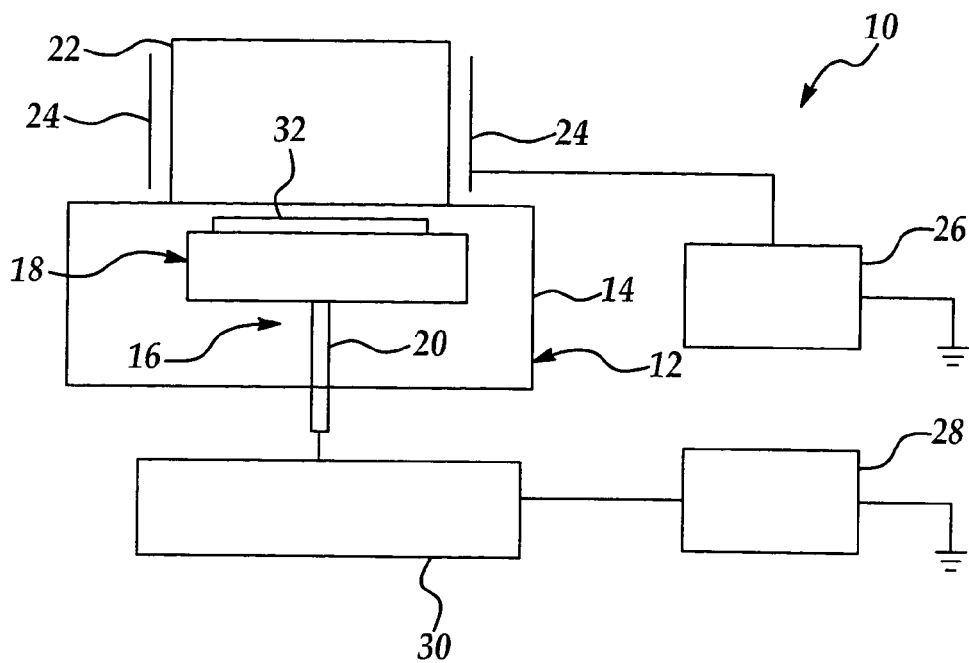
FIG. 1 is a schematic of a typical conventional pre-clean chamber used in the pre-cleaning of substrates.
Figure 2:
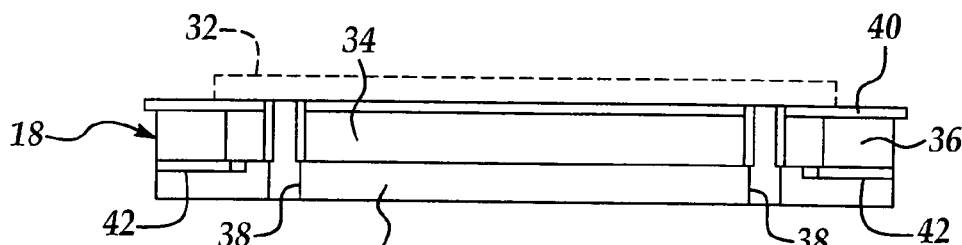
FIG. 2 is a cross-sectional view of a conventional pedestal assembly for a pre-clean chamber.

The process of the present invention has particularly beneficial utility in reducing or preventing the formation of potential device-contaminating particles in a pre-clean chamber used to pre-clean substrates prior to further IC (integrated circuit) fabrication processing, such as the physical vapor deposition of a conductive layer on the substrates, for example. However, the invention is equally adaptable to reducing or preventing the formation of particles in any type of etch chamber or process chamber which is conventionally equipped with antennae for conducting RF DC bias power from an RF bias power source to a pedestal that supports a substrate.

The novel process of the present invention is effective in reducing or eliminating the formation of potential device-contaminating particles in a process chamber. In particular, the process of the present invention is suitably adapted for reducing or eliminating generation of particles in an etch chamber or a pre-clean chamber used to pre-clean substrates prior to a PVD or other process. Such a pre-clean chamber conventionally includes multiple, symmetrically-spaced antennae which extend through an insulator of a pedestal assembly that supports a substrate. Typically, three polysilicon antennae extend in spaced-apart relationship to each other through respective antenna openings in the insulator. In the conventional substrate pre-clean process, the function of the antennae is to conduct bias power from an RF bias power source to a substrate supported on a conductive pedestal that is seated in the insulator of the pedestal assembly. Accordingly, the antennae stabilize the DC bias power applied to the pedestal and to the substrate supported thereon.

According to the process of the invention, the antennae are removed from the insulator of the pedestal assembly. The antenna openings remaining in the insulator are typically filled with an insulator material to form a generally solid insulator which is substantially devoid of antenna openings. In a preferred embodiment the insulator is quartz, although alternative insulative materials such as ceramic, in non-exclusive particular, may be used. Alternatively, the insulator may be specially-fabricated without openings for the antennae. Accordingly, the antennae, no longer present in the chamber during substrate processing, neither generate potential device-contaminating particles nor serve as a conduit for electrical arcing between the pedestal assembly and the chamber wall, shielding or other elements in the process chamber, which electrical arcing would otherwise lead to operational power loss and an unstable DC bias power. It has been found that the DC bias power can be stabilized for optimum processing in the pre-clean chamber from which the antennae have been removed. Moreover, the Cp yield data and WAT data of the process of the invention have been shown to be comparable with the Cp yield data and WAT data of the conventional pre-clean process.

The process of the present invention may further include the step of matching chamber impedences in a process chamber such as a pre-cleaning chamber from which antennae have been removed. This impedence-matching sequence adjusts the forward and reflective RF power to maintain a stable DC bias power during plasma induction. This may be achieved by providing a multi-step plasma ignition control or power adjustment sequence to maintain stable chamber conditions during the process. The sequence may include a gradual power ramp-up procedure for applying RF energies of increasing magnitude to the chamber. Typically, the gradual power ramp-up procedure is a two-step procedure. The gradual ramp-up procedure may include, for example, a first step in which the RF source power is ramped up from 0 watts to typically about 100 watts and the DC bias power is ramped up from 0 watts to typically about 35 watts. This may be followed by a second step in which the RF source power is ramped up from typically about 100 watts to typically about 340 watts and the DC bias power is ramped up from typically about 35 watts to typically about 440 watts for the substrate etching or cleaning step.

Figure 3:
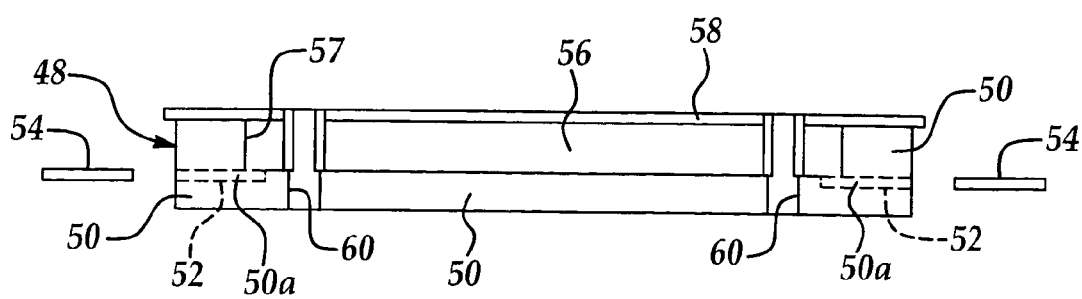
FIG. 3 is a cross-sectional view of a pedestal assembly in accordance with the process of the present invention.

Referring to FIG. 3, a conventional wafer pedestal assembly 48 for a process chamber such as a pre-clean chamber (not shown) is shown, which wafer pedestal assembly 48 is suitable for implementation of the present invention. The wafer pedestal assembly 48 includes an insulator 50 which is an electrically-insulative material such as ceramic or quartz, for example. A pedestal 56 is typically seated in a pedestal cavity 57 provided in the upper surface of the insulator 50. The pedestal 56 is a non-reactive, conductive metal such as aluminum or titanium, for example. The conventional wafer pedestal assembly 48 includes multiple, typically three, antenna openings 52, each of which contains a polysilicon antenna 54. The wafer pedestal assembly 48 may further include one or multiple lift pin openings 60 and a typically quartz cover plate 58 provided on the pedestal 56. During operation of the conventional pre-clean chamber, the antennae 54 normally conduct DC bias power from an RF bias power supply (not shown) to the pedestal 56 and to a substrate (not shown) supported thereon, as heretofore described with respect to the pre-clean chamber 10 of FIG. 1.

Figure 4:
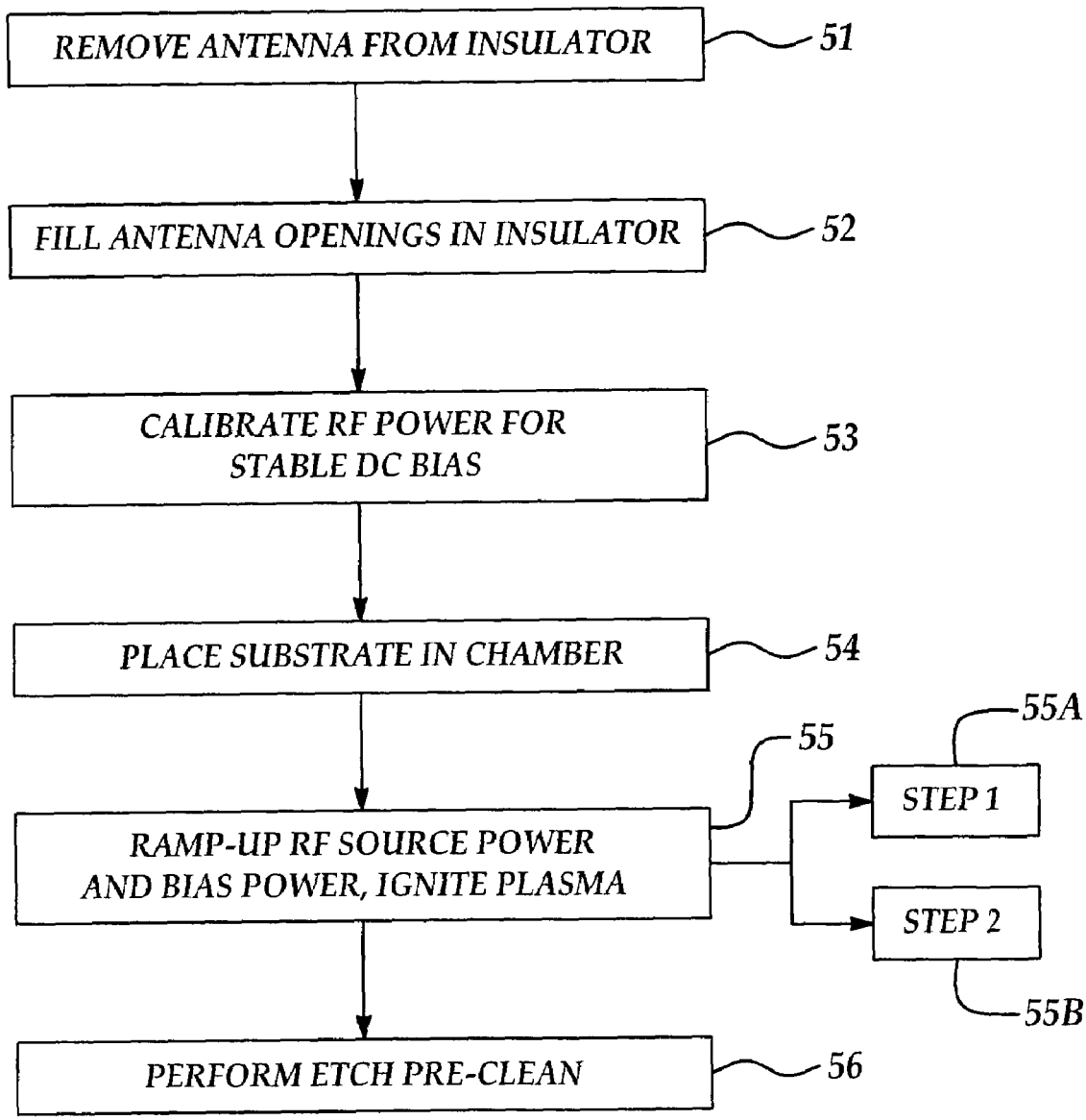
FIG. 4 is a flow diagram illustrating a typical sequence of process steps according to the process of the present invention.

Referring next to FIGS. 3 and 4, according to the process of the present invention the wafer pedestal assembly 48 is typically initially removed from the process chamber (not shown). As indicated in step S1 of FIG. 4 and as shown in FIG. 3, the antennae 54, as well as any retainer clips or elements (not shown) for securing the antennae 54 in the respective antenna openings 52, are removed from the respective antenna openings 52 in the insulator 50. As indicated in step S2 of FIG. 4, each of the antenna openings 52 is then filled with an insulator material 50a, such as ceramic or quartz, for example, according to techniques known by those skilled in the art. The wafer pedestal assembly 48 is then replaced in the pre-clean chamber. A dummy wafer (not shown) is then placed on the wafer pedestal assembly 48 to carry out a calibration procedure for the DC bias power, as indicated in step S3. During the calibration procedure, the forward and reflective powers of the RF source power supply are adjusted to ensure a stable DC bias power to the substrate and decrease RF reflective power during plasma induction. Upon successful calibration of the RF source power supply, the dummy wafer is removed from the chamber and, as indicated in step S4, the substrate to be processed is placed in the pre-clean chamber for pre-cleaning of the substrate.

After the substrate to be pre-cleaned has been placed on the pedestal assembly 48 in the pre-cleaning chamber, the etchant plasma-forming gas, preferably argon, is introduced into the chamber at a flow rate of typically about 100 sccm for typically about 7.0 seconds. As indicated in step S5 of FIG. 4, the RF source power and DC bias power of the pre-clean chamber are then ramped up preparatory to pre-clean etching of the substrate, with the RF source power operating at a frequency of typically about 400 KHz and the DC bias power operating at a frequency of typically about 13.56 MHz. Preferably, the ramp-up process is a two-step process which promotes stable processing conditions in the pre-clean chamber and reduces the reflective RF power therein. Accordingly, step 1 of the two-step process, indicated as step S5a of FIG. 4, includes increasing the RF source power from 0 to typically about 100 watts, and the DC bias power from 0 to typically about 35 watts, and maintaining this RF source power and DC bias power for a period of typically about 3 seconds before beginning step 2 of the process. Step 2 of the process, indicated as step S5b of FIG. 4, includes increasing the RF source power from typically about 100 watts to typically about 340 watts, and the DC bias power from typically about 35 watts to typically about 440 watts, over a period of typically about 3 seconds to ignite and sustain the argon plasma in the chamber. The etch pre-clean process, indicated in step S6, is then carried out for typically about 12.5 seconds to etch material residues, such as oxides, from the substrate, although this time period may be longer or shorter depending on the particular application. The substrate is finally released from the wafer pedestal assembly 48 using a BSP (backside pressure) of typically about 0 Torr for typically about 3.0 seconds.

The process conditions for the pre-clean process, including the DC bias power and RF source power at each step, are summarized in Table I.

TABLE I

| STEP | Wait | Flow | Ignition(1) | Ignition(2) | Etch | Power Off | BSP |
|---|---|---|---|---|---|---|---|
| TIME | 1.0 s | 7.0 s | 3.0 s | 3.0 s | 12.5 s | 1.0 s | 3.0 s |
| BIAS | 0 W, Auto | 0 W, Auto | 35 W, Auto | 35 W, Auto | 440 W, Auto | 1 W, Auto | 0 W, Auto |
| SOURCE | 0 W | 0 W | 100 W | 100 W | 340 W | 225 W | 0 W |

It will be appreciated by those skilled in the art that the process of the present invention exhibits CP yield data and WAT data which are comparable to the CP yield data and WAT data of the conventional pre-clean process. Furthermore, due to removal of the antennae from the pedestal assembly in the process chamber, the process of the invention facilitates simpler and more effective and efficient periodic maintenance (PM) of the chamber and eliminates the possibility of antenna-induced malfunctioning during chamber operation, since the antennae and their associated components need not be replaced or maintained in the chamber. Moreover, PM frequency intervals are increased from the average of one PM cycle per 3,000 pieces with respect to the conventional process to one PM cycle per 12,000 pieces with respect to the process of the invention.

While the preferred embodiments of the invention have been described above, it will be recognized and understood that various modifications can be made in the invention and the appended claims are intended to cover all such modifications which may fall within the spirit and scope of the invention.

What is claimed is:

1. A process for reducing generation of particles in a process chamber having a pedestal assembly for supporting a substrate and at least one antenna provided in said pedestal assembly for conducting bias power, comprising the steps of:
    removing said at least one antenna from said pedestal assembly; and
    processing said substrate in said process chamber without said at least one antenna in said pedestal assembly.

2. The process of claim 1 wherein said removing said at least one antenna from said pedestal assembly comprises the step of removing said at least one antenna from at least one antenna opening in said pedestal assembly and further comprising the step of filling said at least one antenna opening.

3. The process of claim 2 further comprising the steps of applying a first magnitude of source power to said process chamber and applying a second magnitude of source power to said process chamber after said first magnitude of source power.

4. The process of claim 2 wherein said pedestal assembly comprises an insulator and a pedestal carried by said insulator for supporting said substrate, and wherein said at least one antenna opening extends through said insulator.

5. The process of claim 4 further comprising the steps of applying a first magnitude of source power to said process chamber and applying a second magnitude of source power to said process chamber after applying said first magnitude of source power.

6. The process of claim 4 wherein said pedestal comprises aluminum.

7. The process of claim 6 further comprising the steps of increasing a source power for said chamber from 0 watts to about 100 watts and then increasing said source power from about 100 watts to about 340 watts.

8. The process of claim 1 further comprising the steps of applying a first magnitude of source power to said process chamber and applying a second magnitude of source power to said process chamber after applying said first magnitude of source power.

9. The process of claim 8 wherein said applying a first magnitude of source power to said process chamber comprises increasing said source power from 0 watts to about 100 watts and said applying a second magnitude of source power to said process chamber comprises increasing said source power from about 100 watts to about 340 watts.

10. The process of claim 9 wherein said removing said at least one antenna from said pedestal assembly comprises the step of removing said at least one antenna from at least one antenna opening in said pedestal assembly and further comprising the step of filling said at least one antenna opening.

11. The process of claim 10 wherein said pedestal assembly comprises an insulator and a pedestal carried by said insulator for supporting said substrate, and wherein said at least one antenna opening extends through said insulator.

12. The process of claim 11 wherein said at least one antenna opening comprises a plurality of antenna openings and said at least one antenna comprises a plurality of antennae.

13. A process for reducing generation of particles in a pre-clean chamber having a pedestal assembly for supporting a substrate and a plurality of antennae provided in said pedestal assembly for conducting bias power, comprising the steps of:
    removing said plurality of antennae from said pedestal assembly; and
    subjecting said substrate to a pre-clean etch process in said pre-clean chamber without said plurality of antennae in said pedestal assembly.

14. The process of claim 13 further comprising the steps of applying a first magnitude of source power to said process chamber and applying a second magnitude of source power to said process chamber after said first magnitude of source power.

15. The process of claim 13 wherein said pedestal assembly comprises an insulator and a pedestal carried by said insulator for supporting said substrate.

16. The process of claim 15 wherein said removing said plurality of antennae from said pedestal assembly comprises the step of removing said plurality of antennae from a plurality of antenna openings in said insulator and further comprising the step of filling said plurality of antenna openings.

17. The process of claim 16 further comprising the steps of applying a first magnitude of source power to said pre-clean chamber and applying a second magnitude of source power to said pre-clean chamber after said first magnitude of source power.

18. A process for reducing generation of particles in a pre-clean chamber having a pedestal assembly for supporting a substrate and a plurality of antennae provided in said pedestal assembly for conducting bias power, comprising the steps of:
    removing said plurality of antennae from said pedestal assembly;
    increasing a source power for said chamber to about 100 watts;
    increasing said source power from about 100 watts to about 340 watts; and
    subjecting said substrate to a pre-clean etch process without said plurality of antennae in said pedestal assembly.

19. The process of claim 18 wherein said removing said plurality of antennae from said pedestal assembly comprises the step of removing said plurality of antennae from a plurality of antenna openings in said pedestal assembly and further comprising the step of filling said plurality of antenna openings.

20. The process of claim 19 wherein said pedestal assembly comprises an insulator and a pedestal carried by said insulator for supporting said substrate, and wherein said plurality antenna openings extends through said insulator.

* * * * *